US009917096B2

(12) United States Patent
Kamigaichi

(10) Patent No.: US 9,917,096 B2
(45) Date of Patent: Mar. 13, 2018

(54) SEMICONDUCTOR MEMORY DEVICE AND METHOD FOR MANUFACTURING SAME

(71) Applicant: Toshiba Memory Corporation, Minato-ku (JP)

(72) Inventor: Takeshi Kamigaichi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/633,405

(22) Filed: Feb. 27, 2015

(65) Prior Publication Data

US 2016/0071871 A1 Mar. 10, 2016

Related U.S. Application Data

(60) Provisional application No. 62/048,410, filed on Sep. 10, 2014.

(51) Int. Cl.
*H01L 21/02* (2006.01)
*H01L 29/792* (2006.01)
(Continued)

(52) U.S. Cl.
CPC .. *H01L 27/11582* (2013.01); *H01L 21/28282* (2013.01); *H01L 29/45* (2013.01); *H01L 29/495* (2013.01); *H01L 29/7926* (2013.01)

(58) Field of Classification Search
CPC . H01L 27/0203; H01L 27/0207; H01L 27/10; H01L 27/105; H01L 27/1052; H01L 27/108; H01L 27/10844; H01L 27/10894; H01L 27/10841; H01L 27/11273; H01L 27/11551–27/11556; H01L 27/11578–27/11582; H01L 27/2454; H01L 27/2481; H01L 27/249; H01L 29/66666; H01L 29/66712; H01L 29/66734; H01L 29/732; H01L 29/7788; H01L 29/7802; H01L 29/7827–29/7828; H01L 29/8122; H01L 29/7926; H01L 29/7889

See application file for complete search history.

(56) References Cited

U.S. PATENT DOCUMENTS 7,927,953 B2 * 4/2011 Ozawa .............. H01L 21/28282
257/E21.21
8,048,741 B2 * 11/2011 Arai ...................... H01L 27/105
257/365

(Continued)

*Primary Examiner* — Maliheh Malek
(74) *Attorney, Agent, or Firm* — Oblon, McClelland, Maier & Neustadt, L.L.P.

(57) ABSTRACT

According to one embodiment, a semiconductor memory device includes a stacked body including a plurality of electrode layers and a plurality of inter-layer insulating layers each provided between the plurality of electrode layers; and a columnar portion penetrating the stacked body and extending in a stacking direction of the stacked body. The columnar portion includes a channel body extending in the stacking direction; and a charge storage film provided between the channel body and each of the electrode layers. Each of the electrode layers includes an edge portion provided closer on a central axis side of the columnar portion than the inter-layer insulating layers. The charge storage film covers the edge portion of each of the electrode layers and separated from each other in the stacking direction.

11 Claims, 8 Drawing Sheets

(51) Int. Cl.
*H01L 27/11582* (2017.01)
*H01L 29/45* (2006.01)
*H01L 29/49* (2006.01)
*H01L 21/28* (2006.01)
*H01L 27/115* (2017.01)

(56) References Cited

U.S. PATENT DOCUMENTS

| | | | | |
|---|---|---|---|---|
| 8,089,120 B2* | 1/2012 | Tanaka | H01L 27/11582 | 257/314 |
| 8,163,617 B2* | 4/2012 | Ahn | H01L 21/28273 | 257/E21.41 |
| 8,178,919 B2* | 5/2012 | Fujiwara | H01L 27/11524 | 257/319 |
| 8,198,667 B2* | 6/2012 | Kuniya | H01L 27/115 | 257/315 |
| 8,208,279 B2* | 6/2012 | Lue | H01L 27/0688 | 365/148 |
| 8,237,213 B2* | 8/2012 | Liu | H01L 27/11565 | 257/319 |
| 8,335,111 B2* | 12/2012 | Fukuzumi | G11C 16/0483 | 257/324 |
| 8,373,222 B2* | 2/2013 | Sekine | H01L 21/28282 | 257/319 |
| 8,487,365 B2* | 7/2013 | Sasaki | H01L 27/11578 | 257/324 |
| 8,502,300 B2* | 8/2013 | Fukuda | G11C 16/0416 | 257/324 |
| 8,569,827 B2* | 10/2013 | Lee | H01L 27/11582 | 257/315 |
| 8,581,330 B2* | 11/2013 | Kiyotoshi | H01L 29/7926 | 257/324 |
| 8,664,101 B2* | 3/2014 | Kim | H01L 29/7926 | 257/E21.409 |
| 8,743,612 B2* | 6/2014 | Choi | G11C 16/0483 | 365/185.11 |
| 8,916,922 B2* | 12/2014 | Jang | H01L 27/11565 | 257/319 |
| 8,941,154 B2* | 1/2015 | Ahn | H01L 27/11582 | 257/288 |
| 8,952,446 B2* | 2/2015 | Tanaka | H01L 29/66833 | 257/326 |
| 9,053,976 B2* | 6/2015 | Ernst | H01L 21/8221 | |
| 9,054,132 B2* | 6/2015 | Sato | H01L 29/66833 | |
| 9,093,479 B2* | 7/2015 | Son | H01L 27/11582 | |
| 9,130,054 B2* | 9/2015 | Jang | H01L 29/792 | |
| 9,136,130 B1* | 9/2015 | Wada | H01L 27/11556 | |
| 9,136,392 B2* | 9/2015 | Murakami | H01L 29/66833 | |
| 9,177,613 B2* | 11/2015 | Lee | H01L 27/11519 | |
| 9,178,077 B2* | 11/2015 | Davis | H01L 27/11556 | |
| 9,183,935 B2* | 11/2015 | Fukuzumi | G11C 16/0483 | |
| 9,184,178 B2* | 11/2015 | Jang | H01L 27/11565 | |
| 9,230,975 B2* | 1/2016 | Sakuma | H01L 27/11556 | |
| 9,349,597 B2* | 5/2016 | Park | H01L 29/7926 | |
| 9,741,735 B2* | 8/2017 | Lee | H01L 27/11582 | |
| 9,773,798 B2* | 9/2017 | Han | H01L 21/76877 | |
| 2002/0195668 A1* | 12/2002 | Endoh | H01L 27/115 | 257/390 |
| 2007/0252201 A1* | 11/2007 | Kito | H01L 21/8221 | 257/331 |
| 2008/0179659 A1* | 7/2008 | Enda | H01L 27/115 | 257/326 |
| 2008/0265235 A1* | 10/2008 | Kamigaichi | H01L 27/2409 | 257/2 |
| 2009/0090960 A1* | 4/2009 | Izumi | H01L 27/115 | 257/324 |
| 2009/0173981 A1* | 7/2009 | Nitta | H01L 21/84 | 257/302 |
| 2009/0230458 A1* | 9/2009 | Ishiduki | H01L 27/11565 | 257/324 |
| 2009/0283819 A1* | 11/2009 | Ishikawa | H01L 21/28282 | 257/324 |
| 2009/0294828 A1* | 12/2009 | Ozawa | H01L 27/11582 | 257/319 |
| 2009/0321813 A1* | 12/2009 | Kidoh | H01L 29/42348 | 257/324 |
| 2010/0059811 A1* | 3/2010 | Sekine | H01L 21/28282 | 257/324 |
| 2010/0090286 A1* | 4/2010 | Lee | H01L 27/11526 | 257/368 |
| 2010/0120214 A1* | 5/2010 | Park | H01L 27/11578 | 438/287 |
| 2010/0155810 A1* | 6/2010 | Kim | H01L 27/11548 | 257/316 |
| 2010/0155818 A1* | 6/2010 | Cho | H01L 27/11578 | 257/324 |
| 2010/0163968 A1* | 7/2010 | Kim | H01L 27/11565 | 257/324 |
| 2010/0171162 A1* | 7/2010 | Katsumata | H01L 27/0688 | 257/314 |
| 2010/0202206 A1* | 8/2010 | Seol | G11C 16/0408 | 365/185.17 |
| 2010/0207185 A1* | 8/2010 | Lee | H01L 21/28282 | 257/314 |
| 2010/0207194 A1* | 8/2010 | Tanaka | H01L 27/11578 | 257/324 |
| 2010/0207195 A1* | 8/2010 | Fukuzumi | G11C 16/0483 | 257/326 |
| 2010/0213537 A1* | 8/2010 | Fukuzumi | H01L 27/11578 | 257/326 |
| 2010/0213538 A1* | 8/2010 | Fukuzumi | G11O 5/02 | 257/326 |
| 2010/0258852 A1* | 10/2010 | Lim | H01L 27/11551 | 257/324 |
| 2010/0276743 A1* | 11/2010 | Kuniya | H01L 27/115 | 257/315 |
| 2010/0283097 A1* | 11/2010 | Endoh | C23C 16/308 | 257/324 |
| 2010/0315875 A1* | 12/2010 | Kim | G11C 16/0483 | 365/185.17 |
| 2011/0018051 A1* | 1/2011 | Kim | H01L 27/11575 | 257/324 |
| 2011/0065270 A1* | 3/2011 | Shim | H01L 27/11556 | 438/589 |
| 2011/0092033 A1* | 4/2011 | Arai | H01L 27/11556 | 438/152 |
| 2011/0147823 A1* | 6/2011 | Kuk | H01L 27/11551 | 257/324 |
| 2011/0156132 A1* | 6/2011 | Kiyotoshi | H01L 27/11575 | 257/326 |
| 2011/0169067 A1* | 7/2011 | Ernst | H01L 21/8221 | 257/316 |
| 2011/0216604 A1* | 9/2011 | Mikajiri | G11C 16/04 | 365/185.26 |
| 2011/0248327 A1* | 10/2011 | Son | H01L 27/11551 | 257/315 |
| 2011/0260237 A1* | 10/2011 | Lee | B82Y 10/00 | 257/325 |
| 2011/0266607 A1* | 11/2011 | Sim | G11C 5/02 | 257/314 |
| 2011/0287612 A1* | 11/2011 | Lee | H01L 27/11578 | 438/478 |
| 2011/0291172 A1* | 12/2011 | Hwang | H01L 27/11578 | 257/314 |
| 2011/0291177 A1* | 12/2011 | Lee | H01L 21/28282 | 257/324 |
| 2011/0298013 A1* | 12/2011 | Hwang | H01L 27/11551 | 257/208 |
| 2011/0298037 A1* | 12/2011 | Choe | G11C 16/0483 | 257/324 |
| 2011/0310670 A1* | 12/2011 | Shim | G11C 16/0408 | 365/185.17 |
| 2011/0316064 A1* | 12/2011 | Kim | H01L 27/11582 | 257/314 |
| 2011/0317489 A1* | 12/2011 | Kim | G11C 16/0483 | 365/185.18 |
| 2012/0001247 A1* | 1/2012 | Alsmeier | H01L 27/11551 | 257/316 |

(56) References Cited

U.S. PATENT DOCUMENTS

| | | | |
|---|---|---|---|
| 2012/0001249 A1* | 1/2012 | Alsmeier | H01L 27/11551 257/319 |
| 2012/0001250 A1* | 1/2012 | Alsmeier | H01L 27/11551 257/319 |
| 2012/0001252 A1* | 1/2012 | Alsmeier | H01L 27/11551 257/321 |
| 2012/0032245 A1* | 2/2012 | Hwang | H01L 27/11551 257/314 |
| 2012/0049268 A1* | 3/2012 | Chang, II | H01L 21/28273 257/324 |
| 2012/0051137 A1* | 3/2012 | Hung | G11C 16/0466 365/185.17 |
| 2012/0052672 A1* | 3/2012 | Nakanishi | H01L 27/11582 438/591 |
| 2012/0061741 A1* | 3/2012 | Shim | H01L 27/11521 257/314 |
| 2012/0061743 A1* | 3/2012 | Watanabe | H01L 27/11578 257/324 |
| 2012/0068247 A1* | 3/2012 | Lee | H01L 27/11551 257/316 |
| 2012/0069661 A1* | 3/2012 | Iwai | G11C 16/0483 365/185.11 |
| 2012/0086072 A1* | 4/2012 | Yun | H01L 27/11578 257/329 |
| 2012/0091521 A1* | 4/2012 | Goda | H01L 27/11556 257/328 |
| 2012/0098050 A1* | 4/2012 | Shim | H01L 27/11578 257/324 |
| 2012/0112171 A1* | 5/2012 | Hattori | H01L 27/1157 257/40 |
| 2012/0117316 A1* | 5/2012 | Park | H01L 27/115 711/103 |
| 2012/0134210 A1* | 5/2012 | Maeda | G11C 16/0483 365/185.11 |
| 2012/0156848 A1* | 6/2012 | Yang | H01L 27/11529 438/287 |
| 2012/0168858 A1* | 7/2012 | Hong | H01L 27/11573 257/330 |
| 2012/0181596 A1* | 7/2012 | Liu | H01L 27/11565 257/316 |
| 2012/0182802 A1* | 7/2012 | Hung | G11C 13/0002 365/185.11 |
| 2012/0182805 A1* | 7/2012 | Liu | G11C 16/0483 365/185.17 |
| 2012/0182806 A1* | 7/2012 | Chen | H01L 27/11573 365/185.17 |
| 2012/0184078 A1* | 7/2012 | Kiyotoshi | H01L 27/1157 438/268 |
| 2012/0211820 A1* | 8/2012 | Komori | H01L 29/7926 257/324 |
| 2012/0211821 A1* | 8/2012 | Matsumoto | H01L 27/11575 257/324 |
| 2012/0213009 A1* | 8/2012 | Aritome | G11C 16/0408 365/185.29 |
| 2012/0217564 A1* | 8/2012 | Tang | H01L 27/11524 257/315 |
| 2012/0223412 A1* | 9/2012 | Baars | H01L 23/5223 257/532 |
| 2012/0235220 A1* | 9/2012 | Sekine | H01L 27/11582 257/324 |
| 2012/0235221 A1* | 9/2012 | Ishiduki | H01L 27/11582 257/324 |
| 2012/0241843 A1* | 9/2012 | Iino | H01L 21/76801 257/324 |
| 2012/0241846 A1* | 9/2012 | Kawasaki | H01L 27/11582 257/326 |
| 2012/0248525 A1* | 10/2012 | Lee | H01L 27/11582 257/324 |
| 2012/0256247 A1* | 10/2012 | Alsmeier | H01L 21/764 257/319 |
| 2012/0267699 A1* | 10/2012 | Kiyotoshi | H01L 27/11524 257/319 |
| 2012/0273862 A1* | 11/2012 | Tanzawa | H01L 27/11524 257/314 |
| 2012/0273872 A1* | 11/2012 | Lim | H01L 27/0688 257/329 |
| 2012/0280303 A1* | 11/2012 | Kiyotoshi | H01L 27/11524 257/316 |
| 2012/0280304 A1* | 11/2012 | Lee | H01L 27/11556 257/316 |
| 2012/0307557 A1* | 12/2012 | Itagaki | G11C 16/0483 365/185.02 |
| 2012/0326221 A1* | 12/2012 | Sinha | H01L 21/31111 257/315 |
| 2012/0326222 A1* | 12/2012 | Cheng | H01L 29/7887 257/324 |
| 2012/0327714 A1* | 12/2012 | Lue | G11C 5/02 365/185.17 |
| 2012/0327715 A1* | 12/2012 | Lee | H01L 27/11551 365/185.17 |
| 2013/0016577 A1* | 1/2013 | Nagadomi | G11C 11/5628 365/218 |
| 2013/0032873 A1* | 2/2013 | Kiyotoshi | H01L 27/11582 257/324 |
| 2013/0032874 A1* | 2/2013 | Ko | H01L 29/7926 257/324 |
| 2013/0040429 A1* | 2/2013 | Schrinsky | H01L 21/32134 438/268 |
| 2013/0043521 A1* | 2/2013 | Jung | H01L 27/11556 257/315 |
| 2013/0052803 A1* | 2/2013 | Roizin | H01L 21/28273 438/478 |
| 2013/0059422 A1* | 3/2013 | Lee | H01L 21/764 438/268 |
| 2013/0069139 A1* | 3/2013 | Ishihara | H01L 29/66833 257/324 |
| 2013/0069140 A1* | 3/2013 | Ichinose | H01L 27/11582 257/324 |
| 2013/0069141 A1* | 3/2013 | Pan | G11C 5/02 257/324 |
| 2013/0075807 A1* | 3/2013 | Shim | H01L 27/11565 257/324 |
| 2013/0093005 A1* | 4/2013 | Yun | H01L 27/1157 257/329 |
| 2013/0099304 A1* | 4/2013 | Kim | H01L 29/66825 257/324 |
| 2013/0105902 A1* | 5/2013 | Uenaka | H01L 29/66833 257/368 |
| 2013/0107628 A1* | 5/2013 | Dong | G11C 16/0483 365/185.17 |
| 2013/0113032 A1* | 5/2013 | Matsuda | H01L 29/42344 257/324 |
| 2013/0134493 A1* | 5/2013 | Eom | H01L 29/7926 257/314 |
| 2013/0155771 A1* | 6/2013 | Kim | H01L 29/66833 365/185.05 |
| 2013/0161629 A1* | 6/2013 | Han | H01L 29/66833 257/66 |
| 2013/0161726 A1* | 6/2013 | Kim | H01L 29/792 257/324 |
| 2013/0171787 A1* | 7/2013 | Jeon | H01L 27/11582 438/268 |
| 2013/0201760 A1* | 8/2013 | Dong | G11C 11/5642 365/185.17 |
| 2013/0228852 A1* | 9/2013 | Kitazaki | H01L 29/66666 257/329 |
| 2013/0228853 A1* | 9/2013 | Higuchi | H01L 29/7827 257/329 |
| 2013/0234235 A1* | 9/2013 | Matsuda | H01L 29/66833 257/324 |
| 2013/0234299 A1* | 9/2013 | Murakami | H01L 29/02 257/632 |
| 2013/0237025 A1* | 9/2013 | Yang | H01L 27/11582 438/268 |
| 2013/0270568 A1* | 10/2013 | Rabkin | H01L 29/6675 257/66 |
| 2013/0270643 A1* | 10/2013 | Lee | H01L 27/1052 257/365 |

(56) References Cited

U.S. PATENT DOCUMENTS

| | | | |
|---|---|---|---|
| 2013/0279257 A1* | 10/2013 | Costa | G11C 5/02 365/185.17 |
| 2013/0320425 A1* | 12/2013 | Yasuda | H01L 29/792 257/324 |
| 2013/0334589 A1* | 12/2013 | Ahn | H01L 29/7926 257/324 |
| 2013/0334594 A1* | 12/2013 | Imonigie | H01L 21/32134 257/326 |
| 2013/0341703 A1* | 12/2013 | Shinohara | H01L 29/66833 257/326 |
| 2014/0027835 A1* | 1/2014 | Tanaka | H01L 29/792 257/324 |
| 2014/0043916 A1* | 2/2014 | Costa | G11C 16/14 365/185.25 |
| 2014/0054676 A1* | 2/2014 | Nam | H01L 29/7926 257/324 |
| 2014/0061752 A1* | 3/2014 | Omoto | H01L 29/66825 257/314 |
| 2014/0061770 A1* | 3/2014 | Lee | H01L 29/66825 257/324 |
| 2014/0061773 A1* | 3/2014 | Higuchi | H01L 27/105 257/326 |
| 2014/0187029 A1* | 7/2014 | Seol | H01L 29/42332 438/586 |
| 2014/0191178 A1* | 7/2014 | Boivin | H01L 29/66825 257/2 |
| 2014/0203344 A1* | 7/2014 | Hopkins | H01L 29/42324 257/316 |
| 2014/0220750 A1* | 8/2014 | Sohn | H01L 27/11556 438/269 |
| 2014/0239375 A1* | 8/2014 | Kim | H01L 29/66833 257/324 |
| 2014/0264532 A1* | 9/2014 | Dennison | H01L 29/66833 257/316 |
| 2014/0273373 A1* | 9/2014 | Makala | H01L 27/11582 438/270 |
| 2014/0284686 A1* | 9/2014 | Murakami | H01L 29/66833 257/324 |
| 2014/0284688 A1* | 9/2014 | Hirai | H01L 29/66833 257/324 |
| 2014/0284691 A1* | 9/2014 | Takamura | H01L 29/66833 257/324 |
| 2014/0284693 A1* | 9/2014 | Sato | H01L 29/66833 257/324 |
| 2014/0293702 A1* | 10/2014 | Dong | H01L 27/11519 365/185.17 |
| 2015/0001460 A1* | 1/2015 | Kim | H01L 27/11578 257/5 |
| 2015/0008501 A1* | 1/2015 | Sakuma | H01L 21/28273 257/316 |
| 2015/0014763 A1* | 1/2015 | Lee | H01L 29/792 257/324 |
| 2015/0060992 A1* | 3/2015 | Taekyung | H01L 29/7926 257/324 |
| 2015/0076579 A1* | 3/2015 | Tsuji | H01L 29/7926 257/314 |
| 2015/0076580 A1* | 3/2015 | Pachamuthu | H01L 27/11551 257/314 |
| 2015/0079743 A1* | 3/2015 | Pachamuthu | H01L 27/11551 438/268 |
| 2015/0108562 A1* | 4/2015 | Chen | H01L 27/11582 257/324 |
| 2015/0123189 A1* | 5/2015 | Sun | H01L 27/11556 257/321 |
| 2015/0263126 A1* | 9/2015 | Shingu | H01L 29/518 257/321 |
| 2015/0279857 A1* | 10/2015 | Kim | H01L 27/11582 438/269 |
| 2015/0318301 A1* | 11/2015 | Lee | H01L 27/11582 257/324 |
| 2015/0348984 A1* | 12/2015 | Yada | H01L 27/11524 257/316 |
| 2016/0149010 A1* | 5/2016 | Won | H01L 29/7926 257/326 |
| 2016/0204117 A1* | 7/2016 | Liu | H01L 29/66825 257/324 |

* cited by examiner

SEMICONDUCTOR MEMORY DEVICE AND METHOD FOR MANUFACTURING SAME

This application is based upon and claims the benefit of priority from U.S. Provisional Patent Application 62/048,410 field on Sep. 10, 2014; the entire contents of which are incorporated herein by reference.

FIELD

Embodiments described herein relate generally to a semiconductor memory device and a method for manufacturing same.

BACKGROUND

Memory devices having a three-dimensional structure have been proposed, in which a memory hole is formed in a stacked body in which a plurality of electrode layers functioning as control gates in memory cells are stacked via an insulating layer, and a silicon body serving as a channel is provided on a side wall of the memory hole via a charge storage film.

In the memory device having the three-dimensional structure, there is a fear that stored charge may move between memory cells adjacent to each other in a stacking direction to cause poor reliability.

DETAILED DESCRIPTION

Figure 1:
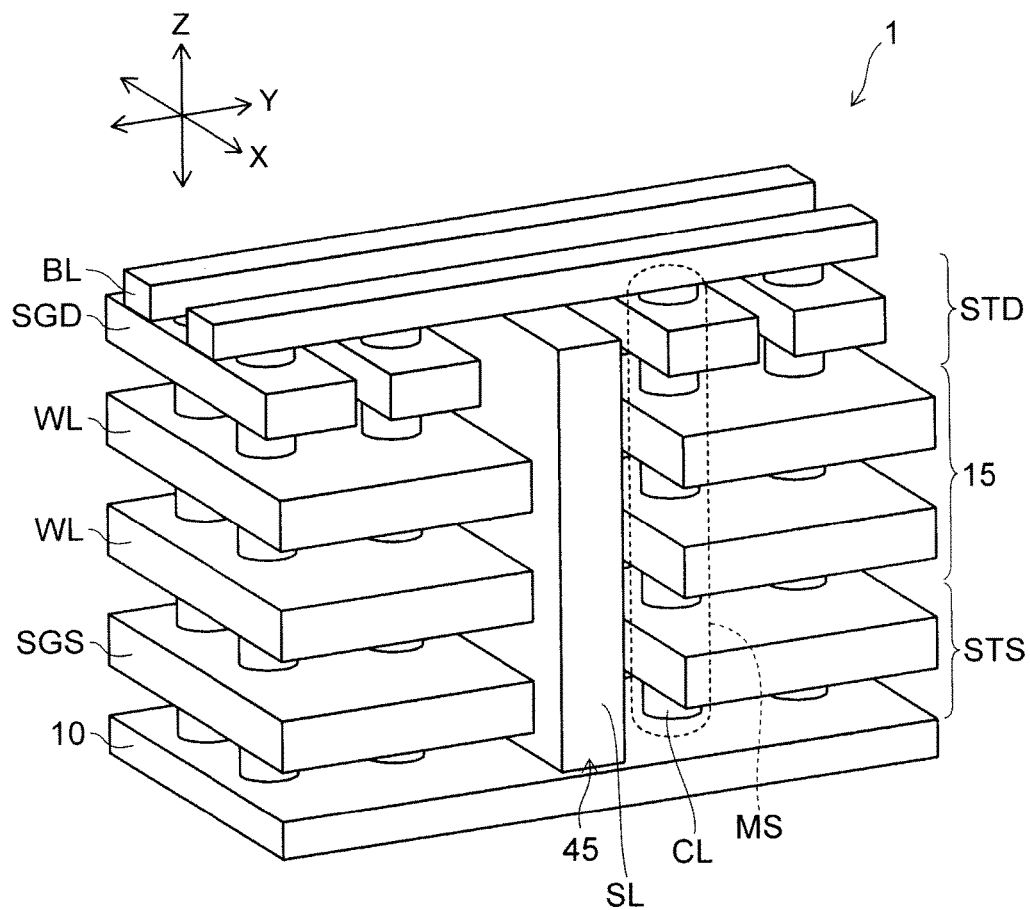
FIG. 1 is a schematic perspective view of a memory cell array of an embodiment.

According to one embodiment, a semiconductor memory device includes a stacked body including a plurality of electrode layers and a plurality of inter-layer insulating layers each provided between the plurality of electrode layers; and a columnar portion penetrating the stacked body and extending in a stacking direction of the stacked body. The columnar portion includes a channel body extending in the stacking direction; and a charge storage film provided between the channel body and each of the electrode layers. Each of the electrode layers includes an edge portion provided closer on a central axis side of the columnar portion than the inter-layer insulating layers. The charge storage film covers the edge portion of each of the electrode layers and separated from each other in the stacking direction.

Hereinafter, embodiments will be described with reference to the drawings. In the drawings, the same elements are denoted by the same reference numerals and signs.

FIG. 1 is a schematic perspective view of a memory cell array 1 of an embodiment. In FIG. 1, insulating layers and the like are not shown for clarity of illustration.

Figure 2A:
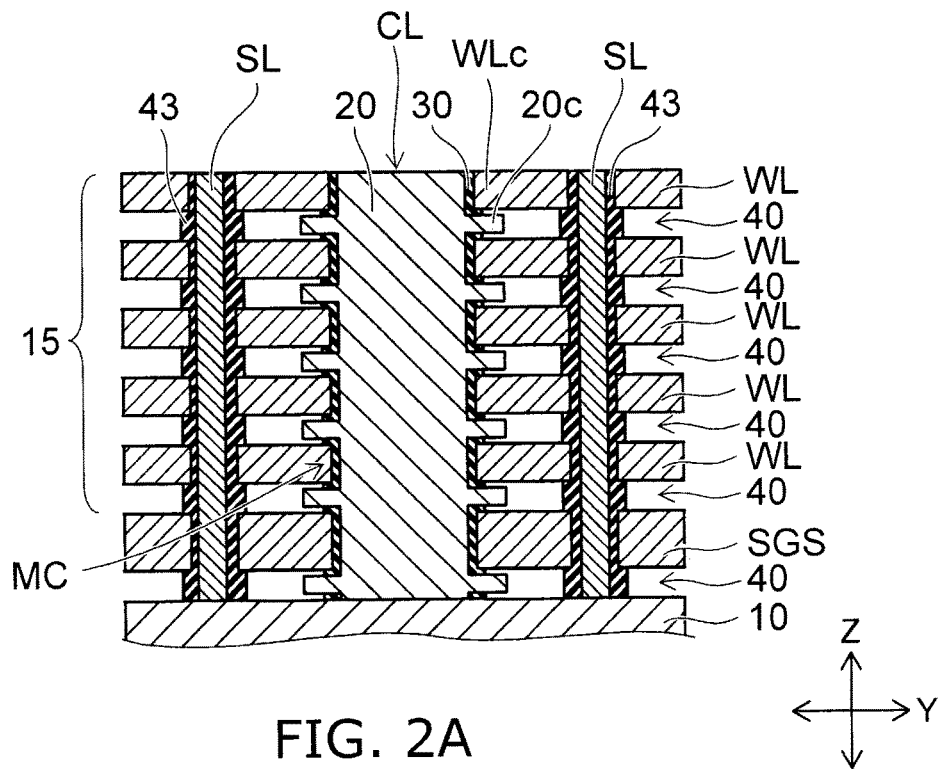
FIG. 2A is a schematic cross-sectional view of a memory strings of the embodiment and FIG. 2B is an enlarged schematic cross-sectional view of a portion of the columnar portion of the embodiment.

FIG. 2A is a schematic cross-sectional view of a memory string of the embodiment. In FIG. 2A, an upper structure located on a stacked body 15 is not shown.

In FIG. 1, two directions parallel to a major surface of a substrate 10 and orthogonal to each other are defined as an X-direction and a Y-direction, and a direction orthogonal to both the X-direction and the Y-direction is defined as a Z-direction (stacking direction).

As shown in FIG. 1, the memory cell array 1 includes a plurality of memory strings MS.

A source-side selection gate SGS is provided on the substrate 10 via an inter-layer insulating layer 40. An inter-layer insulating layer 40 is provided on the source-side selection gate SGS. On the inter-layer insulating layer 40, the stacked body 15 in which a plurality of electrode layers WL and a plurality of inter-layer insulating layers 40 are each alternately stacked is provided. The number of electrode layers WL shown in the drawings is illustrative only, and any number of electrode layers WL may be used. For example, the plurality of electrode layers WL is stacked and separated from each other.

An insulating layer (not shown) is provided on the electrode layer WL in the uppermost layer, and a drain-side selection gate SGD is provided on the insulating layer.

Figure 7:
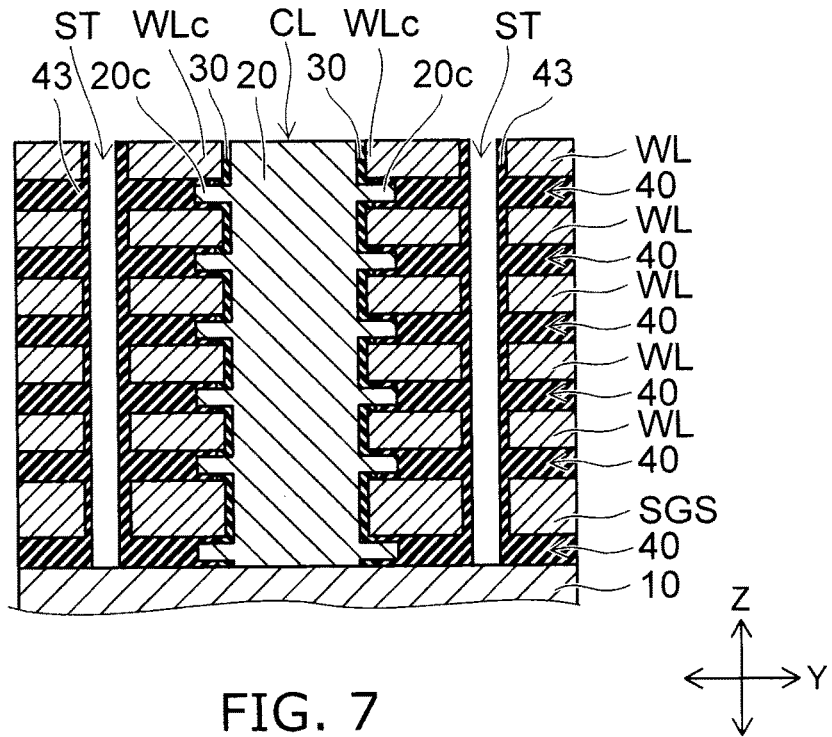

The source-side selection gate SGS, the drain-side selection gate SGD, and the electrode layer WL include, for example, at least any of tungsten and molybdenum. Moreover, the source-side selection gate SGS, the drain-side selection gate SGD, and the electrode layer WL are each, for example, a silicon layer including silicon as a main component. The silicon layer may be doped with, for example, boron as an impurity for providing conductivity, or may include metal and metal silicide (for example, tungsten silicide). Moreover, the source-side selection gate SGS, the drain-side selection gate SGD, and the electrode layer WL may be metal. The inter-layer insulating layer 40 includes a void. The inter-layer insulating layer 40 may be provided with, for example, an insulating film 43 including silicon (FIG. 7).

The thickness of each of the drain-side selection gate SGD and the source-side selection gate SGS is, for example, greater than that of one electrode layer WL, and for example, a plurality of layers may be provided for each of the drain-side selection gate SGD and the source-side selection gate SGS. Moreover, the thickness of each of the drain-side selection gate SGD and the source-side selection gate SGS may be equal to or less than that of one electrode layer WL. In that case, similarly as mentioned above, a plurality of layers may be provided for each of the drain-side selection gate SGD and the source-side selection gate SGS. The "thickness" as used herein means the thickness in the stacking direction (the Z-direction) of the stacked body 15.

A columnar portion CL extending in the Z-direction is provided in the stacked body 15. The columnar portion CL penetrates the drain-side selection gate SGD, the stacked body 15, and the source-side selection gate SGS. The columnar portion CL is formed into, for example, a circular cylindrical or elliptical cylindrical shape.

Trenches ST penetrating the drain-side selection gate SGD, the stacked body 15, and the source-side selection gate SGS are provided in the stacked body 15. A source layer SL is provided in the trench ST. Side surfaces of the source layer SL are covered with the insulating film 43. As the source layer SL, a material having conductivity is used.

A channel body 20 (semiconductor body) of the columnar portion CL and the source layer SL are electrically connected via a conductive layer provided below the source-side selection gate SGS. In the embodiment, a lower end of the channel body 20 and a lower end of the source layer SL reach the substrate 10. The lower end of the channel body 20 and the lower end of the source layer SL are electrically connected via the substrate 10.

An upper end of the source layer SL is electrically connected with a control circuit (not shown).

For example, the source layer SL may be provided between the substrate 10 and the source-side selection gate SGS. In this case, the channel body 20 and the source layer SL are connected with each other below the stacked body 15. A contact portion is provided in the trench ST. The source layer SL is electrically connected with the control circuit via the contact portion.

Figure 2B:
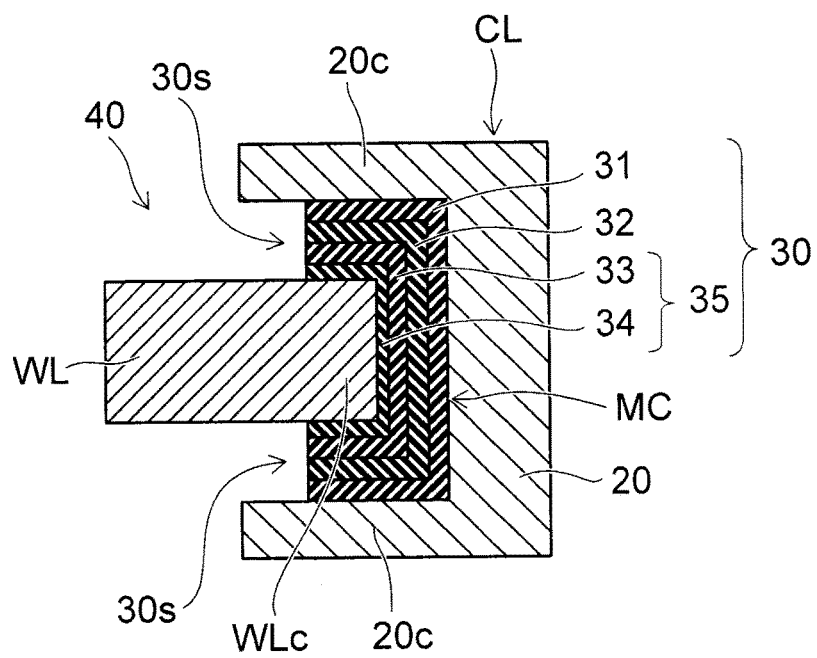

FIG. 2B is an enlarged schematic cross-sectional view of a portion of the columnar portion CL of the embodiment.

The columnar portion CL is formed in a memory hole 15h (FIG. 3B) formed in the stacked body 15 including the plurality of electrode layers WL and the plurality of inter-layer insulating layers 40. In the memory hole, the channel body 20 as a semiconductor channel is provided. The channel body 20 is, for example, a silicon film including silicon as a main component.

The channel body 20 is provided to extend in the stacking direction of the stacked body 15. An upper end of the channel body 20 is connected to a bit line BL (metal interconnect) shown in FIG. 1, and a portion of the channel body 20 on the lower end side is connected to the substrate 10. Each bit line BL extends in the Y-direction.

A memory film 30 is provided between the electrode layer WL and the channel body 20. The memory film 30 includes a block insulating film 35, a charge storage film 32, and a tunnel insulating film 31.

Between the electrode layer WL and the channel body 20, the block insulating film 35, the charge storage film 32, and the tunnel insulating film 31 are provided in this order from the electrode layer WL side. The block insulating film 35 is in contact with the electrode layer WL; the tunnel insulating film 31 is in contact with the channel body 20; and the charge storage film 32 is provided between the block insulating film 35 and the tunnel insulating film 31.

The electrode layers WL surround the channel body 20 via the memory films 30. For example, a core insulating film may be provided inside the channel body 20. The core insulating film is, for example, a silicon oxide film.

The channel body 20 functions as a channel in each of memory cells MC. The electrode layer WL functions as a control gate of the memory cell MC. The charge storage film 32 functions as a data memory layer that stores charge injected from the channel body 20. That is, at intersecting portions between the channel body 20 and the electrode layers WL, the memory cells MC having a structure in which the control gates surround the channel are formed.

In the semiconductor memory device of the embodiment, data can be electrically erased or programmed freely, and the memory contents can be held even when power is turned off.

The memory cell MC is, for example, of a charge trap type. The charge storage film 32 has many trap sites to trap charge, and is, for example, a silicon nitride film.

The tunnel insulating film 31 serves as a potential barrier when charge is injected from the channel body 20 into the charge storage film 32 or when the charge stored in the charge storage film 32 diffuses into the channel body 20. The tunnel insulating film 31 is, for example, a silicon oxide film.

Alternatively, as the tunnel insulating film 31, a stacked film (ONO film) having a structure in which a silicon nitride film is interposed between a pair of silicon oxide films may be used. When the ONO film is used as the tunnel insulating film 31, an erase operation can be performed at a low electric field, compared to a single layer of silicon oxide film.

The block insulating film 35 prevents the charge stored in the charge storage film 32 from diffusing into the electrode layer WL. The block insulating film 35 includes a cap film 34 provided to be in contact with the electrode layer WL and a block film 33 provided between the cap film 34 and the charge storage film 32.

The block film 33 is, for example, a silicon oxide film. The cap film 34 is a film having a permittivity higher than that of a silicon oxide, and is, for example, a silicon nitride film. By providing the cap film 34 to be in contact with the electrode layer WL, back-tunneling electrons injected from the electrode layer WL can be suppressed in erasing. That is, with the use of the stacked film of a silicon oxide film and a silicon nitride film as the block insulating film 35, charge blocking property can be enhanced.

As shown in FIG. 1, a drain-side selection transistor STD is provided at an upper end portion of the columnar portion CL in the memory string MS, while a source-side selection transistor STS is provided at a lower end portion.

The memory cell MC, the drain-side selection transistor STD, and the source-side selection transistor STS are each a vertical transistor in which current flows in the stacking direction (the Z-direction) of the stacked body 15.

The drain-side selection gate SGD functions as a gate electrode (control gate) of the drain-side selection transistor STD. An insulating film that functions as a gate insulating film of the drain-side selection transistor STD is provided between the drain-side selection gate SGD and the channel body 20.

The source-side selection gate SGS functions as a gate electrode (control gate) of the source-side selection transistor STS. An insulating film that functions as a gate insulating film of the source-side selection transistor STS is provided between the source-side selection gate SGS and the channel body 20.

The plurality of memory cells MC each using the electrode layer WL as a control gate are provided between the drain-side selection transistor STD and the source-side selection transistor STS.

The plurality of memory cells MC, the drain-side selection transistor STD, and the source-side selection transistor STS are connected in series through the channel body 20 to configure one memory string MS. The plurality of memory strings MS are arranged in the X-direction and the Y-direction, so that the plurality of memory cells are provided three-dimensionally in the X-direction, the Y-direction, and the Z-direction.

As shown in FIGS. 2A and 2B, the electrode layer WL includes an edge portion WLc. The edge portion WLc is provided closer on a central axis side of the columnar portion CL than a side surface of the inter-layer insulating layer 40.

The channel body 20 includes projecting portions 20c (end portion). The projecting portion 20c is provided between the edge portions WLc of the electrode layers WL, and is in contact with the inter-layer insulating layer 40.

The memory film 30 is continuously provided between the edge portion WLc of the electrode layer WL and the projecting portion 20c of the channel body 20 and between the edge portion WLc and a portion of the channel body 20 extending in the stacking direction (the Z-direction). The memory film 30 entirely covers the edge portion WLc of the electrode layer WL including corner portions (corners) of the electrode layer WL. Since an electric field is likely to be concentrated at the corner portions of the electrode layer WL and the charge storage film 32 is provided so as to cover the corner portions, programming and erasing speeds can be improved.

The memory film 30 (upper, lower, and side surfaces thereof) is covered with the channel body 20. For this reason, the area of the channel body 20 covering the memory film 30 (the charge storage film 32) can be provided to be large in one memory cell MC. That is, the channel length is increased, and a leakage current can be reduced when the gate is turned off.

The memory films 30 are separated from each other via the projecting portion 20c of the channel body 20 in the stacking direction. That is, each of the memory films 30 covers the edge portion WLc of the electrode layers WL so as to form a concave shape, and includes end faces 30s. The end faces 30s of the memory film 30 are recessed from a tip end of the projecting portion 20c of the channel body 20 toward the central axis side of the columnar portion CL.

For example, when the charge storage films 32 of the plurality of memory cells MC adjacent to each other are continuous in the stacking direction, electrons stored in the charge storage film 32 move in the charge storage films 32 that are continuous in the stacking direction in some cases. Due to this, a threshold voltage of each of the memory cells MC may be varied, thereby causing poor reliability.

In contrast, according to the embodiment, the memory films 30 are provided separated from each other for each of the electrode layers WL stacked in the stacking direction. That is, the memory film 30 that is independent is provided in each of the memory cells MC. For this reason, the occurrence of movement of electrons stored in the charge storage film 32 to the adjacent cell, coming out of the electros, or the like is suppressed. Due to this, the variations in the threshold voltage of the memory cell MC are suppressed, and thus the probability of causing poor reliability can be reduced.

For example, when the memory films 30 are continuous in the stacking direction so as to cover the projecting portions 20c of the channel body 20, there is a fear that the memory film 30 may be deteriorated because an electric field is concentrated at corner portions of the memory film 30 covering corner portions of the projecting portion 20c on a tip end side.

In contrast, according to the embodiment, the memory films 30 are divided from each other, and do not cover the corner portions of the projecting portions 20c of the channel body 20 on the tip end side. An electric field is less likely to be concentrated at the end faces 30s of the divided memory film 30 (the block insulating film 35, the charge storage film 32 and the like). Due to this, it is possible to suppress the deterioration of the memory film 30.

Next, a method for manufacturing the semiconductor memory device will be described with reference to FIGS. 3A to 7.

Figure 3A:
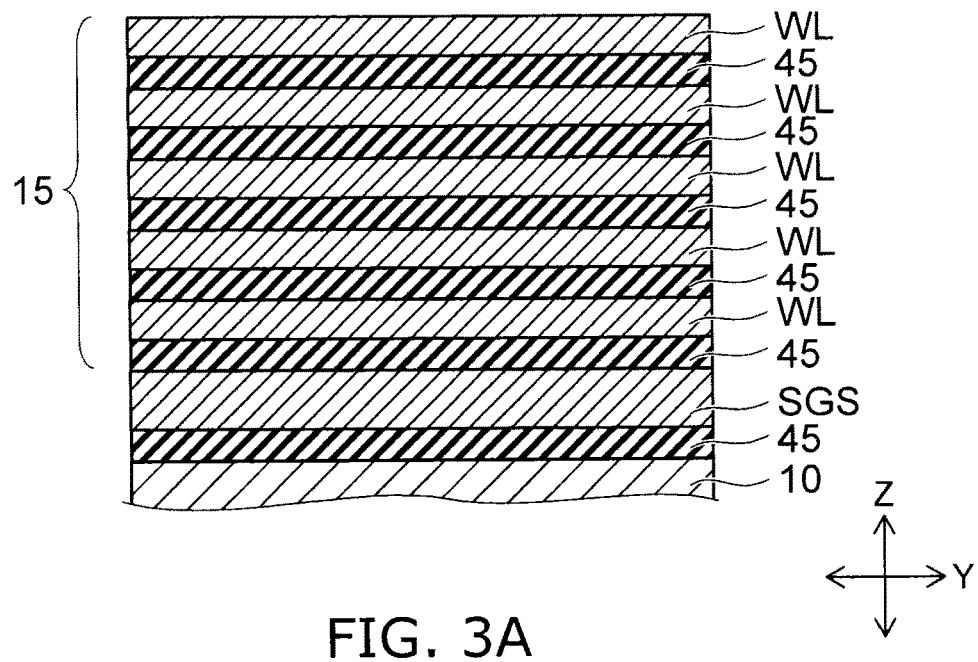
FIG. 3A to FIG. 7 are schematic cross-sectional views showing a method for manufacturing the semiconductor memory device of the embodiment.

As shown in FIG. 3A, the source-side selection gate SGS is formed on the substrate 10 via a sacrificial layer (second layer) 45. A plurality of sacrificial layers 45 and a plurality of electrode layers (first layers) WL are each alternately stacked on the source-side selection gate SGS to form the stacked body 15.

The electrode layer WL includes, for example, at least any of tungsten and molybdenum. As the sacrificial layer 45, for example, at least any of a silicon oxide film and a silicon nitride film is used.

As will be described later, for example, a source layer may be formed on the substrate 10 via an insulating layer. In this case, the source-side selection gate SGS is formed on the source layer via the sacrificial layer 45.

Figure 3B:
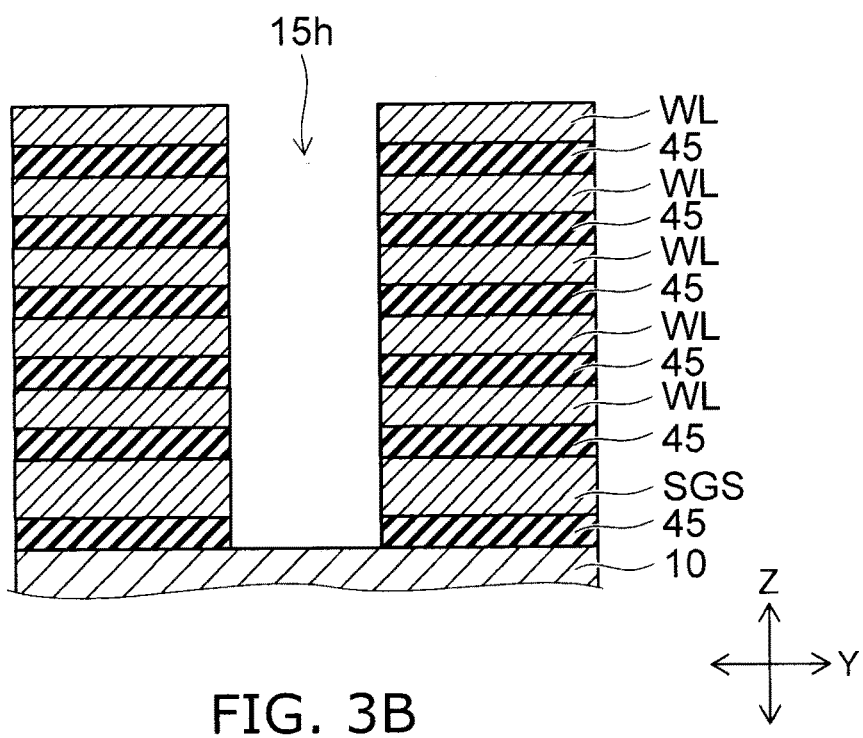

Thereafter, as shown in FIG. 3B, the hole 15h is formed. The hole 15h is formed by a reactive ion etching (RIE) method using a mask (not shown). The hole 15h penetrates the stacked body 15 and the source-side selection gate SGS to reach the substrate 10.

Figure 4A:
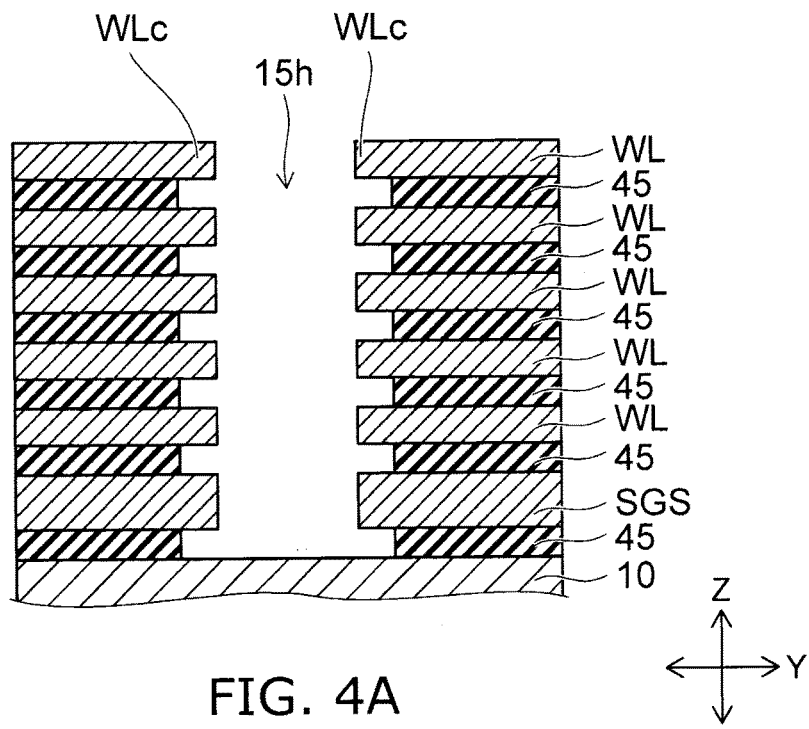

Next, as shown in FIG. 4A, side surfaces of the sacrificial layers 45 exposed in a side wall of the hole 15h are recessed by a wet process or the like. Due to this, the edge portions WLc of the electrode layers WL and an edge portion SGSc of the source-side selection gate SGS are exposed in the hole 15h, and recesses of the sacrificial layers 45 are formed.

Figure 4B:
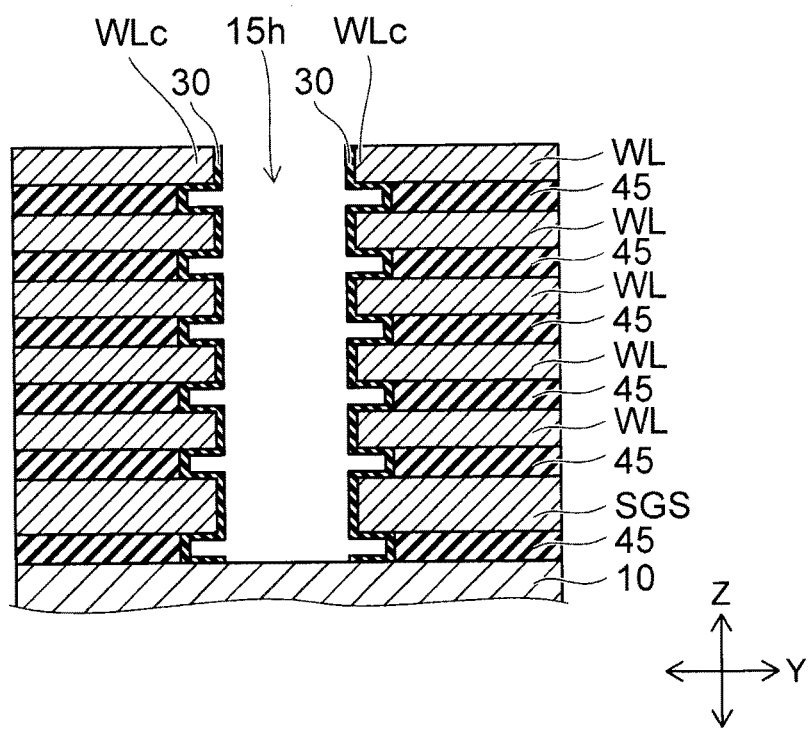

As shown in FIG. 4B, the films (films including the memory film 30) shown in FIG. 2B are conformally formed in an inner wall (side wall and bottom portion) of the hole 15h. Due to this, the edge portions WLc of the electrode layers WL are entirely covered with the memory film 30. The side surfaces of the sacrificial layers 45 are covered with the memory film 30.

The memory film 30 includes, for example, the block insulating film 35, the charge storage film 32, and the tunnel insulating film 31. The block insulating film includes, for example, at least any one of $HfO_x$, $SiO_2$, SiN, AlO, and LaO. The charge storage film 32 includes, for example, at least any of SiN, $HfO_x$, Ru, Ti, Ta, polysilicon, and a metal silicide film. The tunnel insulating film 31 includes, for example, at least any of $SiO_2$, SiN, and AlO.

Thereafter, the memory film 30 formed on the bottom portion of the hole 15h is removed using, for example, a RIE method.

Figure 5A:
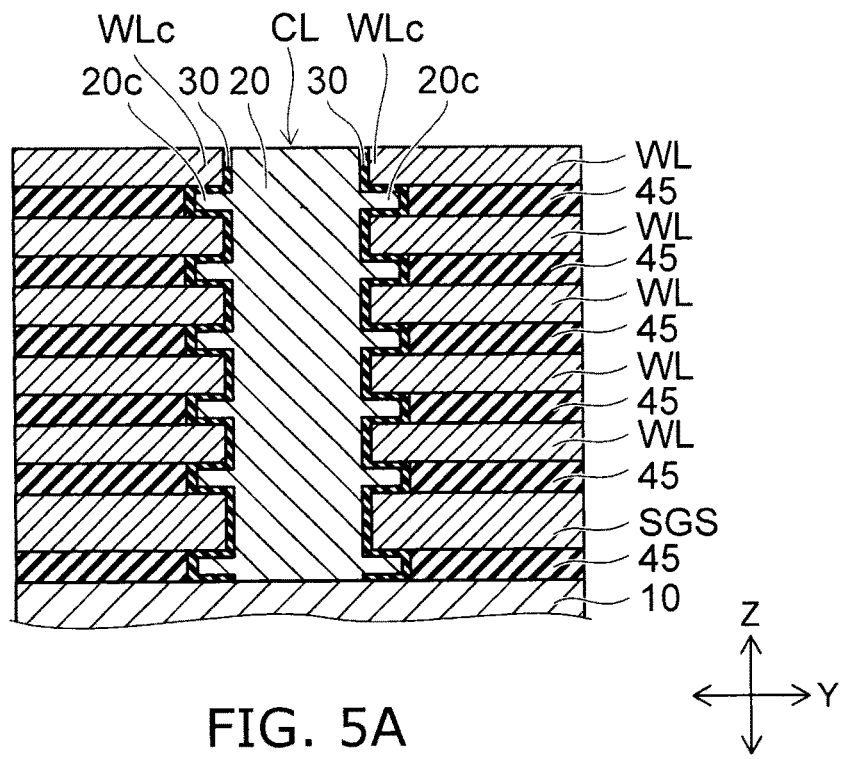

As shown in FIG. 5A, the channel body 20 is embedded in the hole 15h. The channel body 20 is electrically connected with the substrate 10.

As the channel body 20, for example, polysilicon is used. The inner side of the memory film 30 is covered with the channel body 20. The projecting portion 20c of the channel body 20 is formed between the edge portions WLc of the electrode layers WL. Due to this, the columnar portion CL is formed.

Figure 5B:
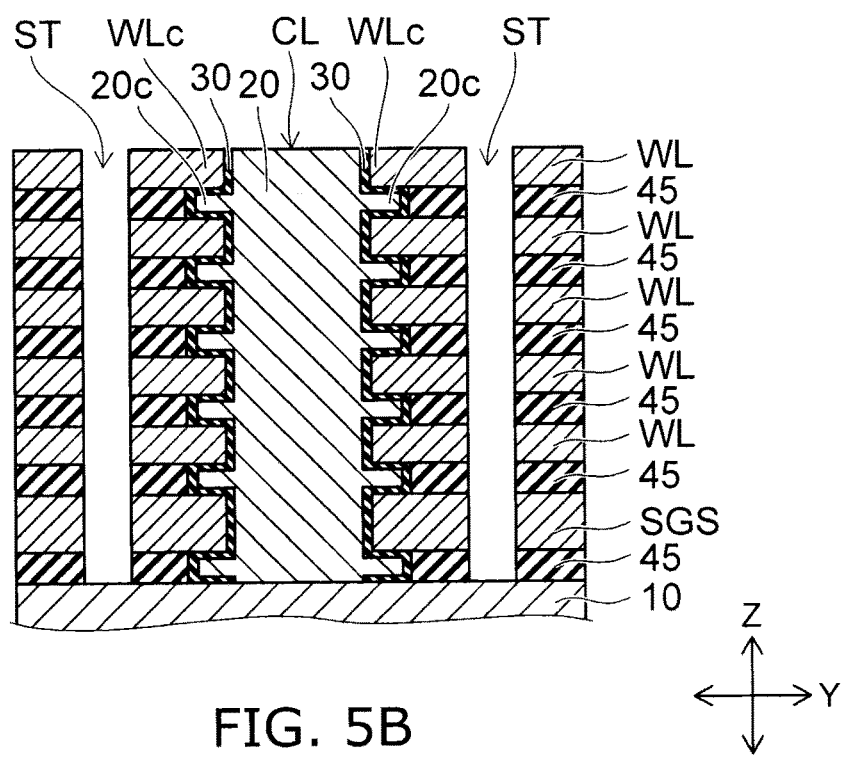

As shown in FIG. 5B, in a region different from a region where the columnar portion CL is formed, the trenches ST penetrating the stacked body 15 in the stacking direction and reaching the substrate 10 are formed. Side surfaces of the electrode layers WL and side surfaces of the sacrificial layers 45 are exposed in side walls of the trench ST.

Figure 6A:
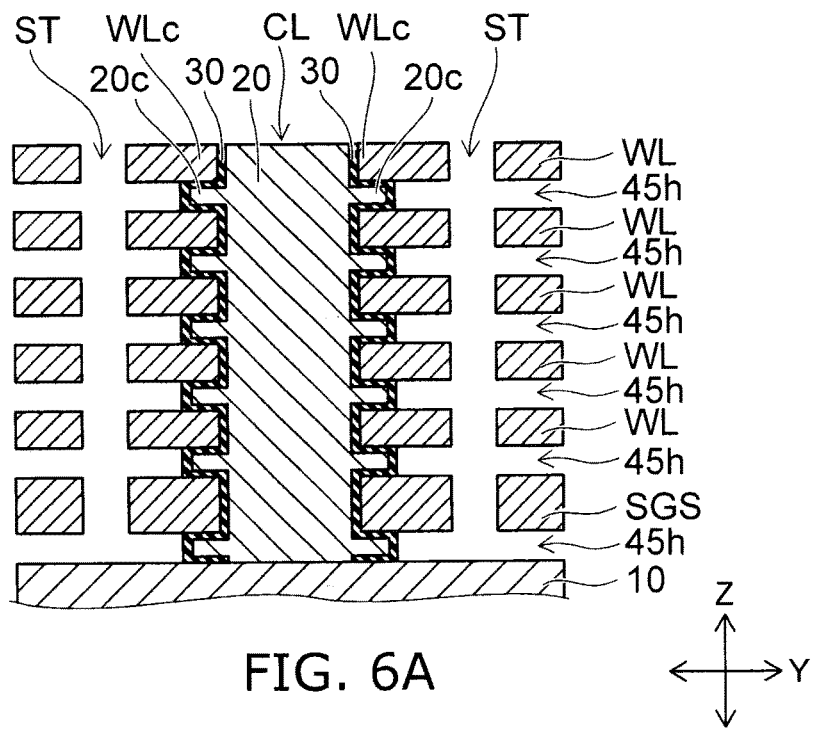

As shown in FIG. 6A, the sacrificial layers 45 are removed through the trench ST by, for example, a wet process. Due to this, cavities 45h are formed. A side surface of the memory film 30 is exposed in each of the cavities 45h.

Figure 6B:
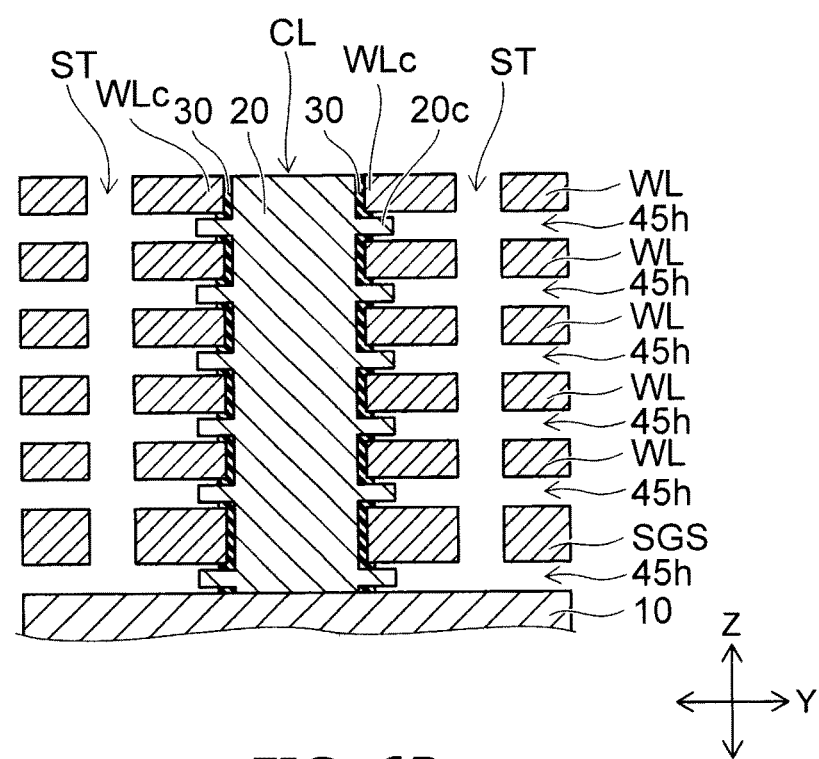

As shown in FIG. 6B, the memory film 30 exposed in the cavities 45h is removed through the trench ST and the cavities 45h. In this case, at least the block insulating film 35 and the charge storage film 32 of the memory film 30 are removed, while the tunnel insulating film 31 may not be removed.

Next, as shown in FIG. 2A, the insulating film 43 is formed on an inner wall of the trench ST. In this case, the insulating film 43 is not embedded in the cavities 45h. Due to this, the inter-layer insulating layer 40 including a void is formed in the cavity 45h.

A trench reaching the substrate 10 is formed on the inner side of the insulating film 43, and a material having conductivity is embedded in the trench to form the source layer SL. The source layer SL is electrically connected with the substrate 10.

Thereafter, the drain-side selection gate SGD is formed on the stacked body 15, and interconnects or the like electrically connected with the channel body 20 and the source layer SL are formed. Due to this, the semiconductor memory device of the embodiment is formed.

For example, when the insulating film 43 is formed on the inner wall of the trench ST, the insulating film 43 may be embedded in the cavities 45h as shown in FIG. 7. In this case, the inter-layer insulating layer 40 including the insulating film 43 is formed in the cavity 45h.

For example, a source layer may be formed on the substrate 10 via an insulating layer. In this case, a material having conductivity is embedded on the inner side of the insulating film 43 in the same manner as in the manufacturing method described above. Due to this, the contact portion electrically connected with the source layer is formed.

Thereafter, the drain-side selection gate SGD is formed on the stacked body 15, and interconnects or the like electrically connected with the channel body 20 and the contact portion are formed. Due to this, the semiconductor memory device of the embodiment is formed.

Figure 8:
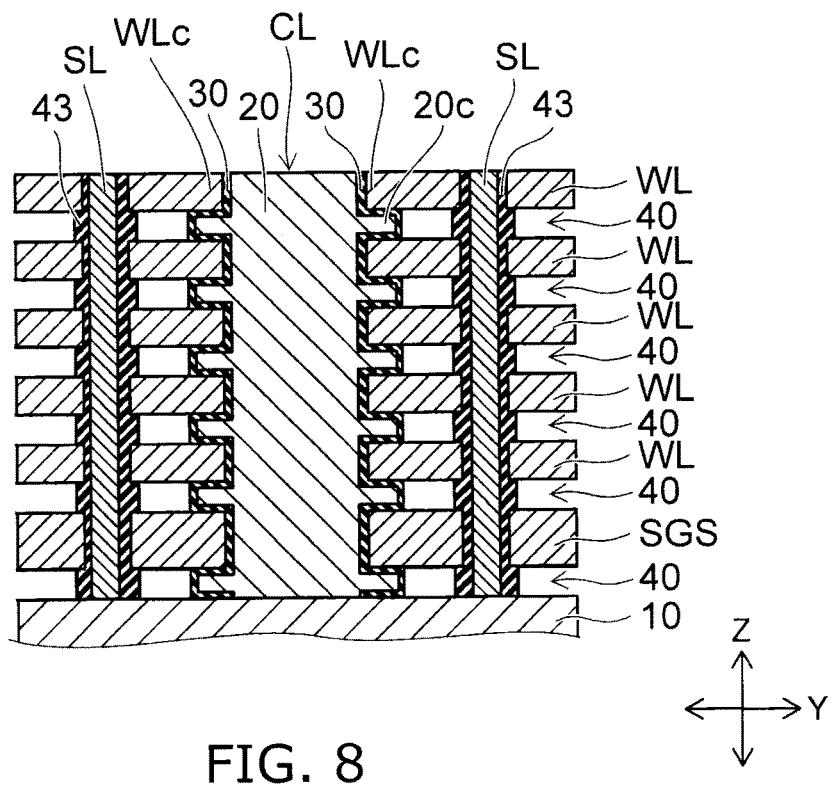
FIG. 8 is a schematic cross-sectional view of a memory strings of another embodiment.

FIG. 8 is a schematic cross-sectional view of a memory string of another embodiment. In FIG. 8, an upper structure located on the stacked body 15 is not shown.

As shown in FIG. 8, the memory film 30 is continuously formed between the electrode layers WL. According to the embodiment, the edge portions WLc of the electrode layers WL are entirely covered with the memory film 30. Due to this, similarly to the embodiment described above, an electric field can be concentrated at the corner portions of the edge portion WLc, and thus programming and erasing speeds can be improved.

Moreover, the projecting portions 20c of the channel body 20 are formed in the columnar portion CL, and the memory film 30 is covered with the channel body 20. Due to this, a leakage current can be reduced when a voltage is not applied.

In addition to the above, the path of the memory film 30 to an adjacent memory cell MC is longer than that when the memory film 30 is provided in a straight line in the stacking direction. Therefore, electrons stored in the charge storage film 32 are less likely to move in the charge storage film 32 that is continuous in the stacking direction. Due to this, variations in the threshold voltage of each of the memory cells MC can be suppressed, and thus the probability of causing poor reliability can be reduced.

Figure 9:
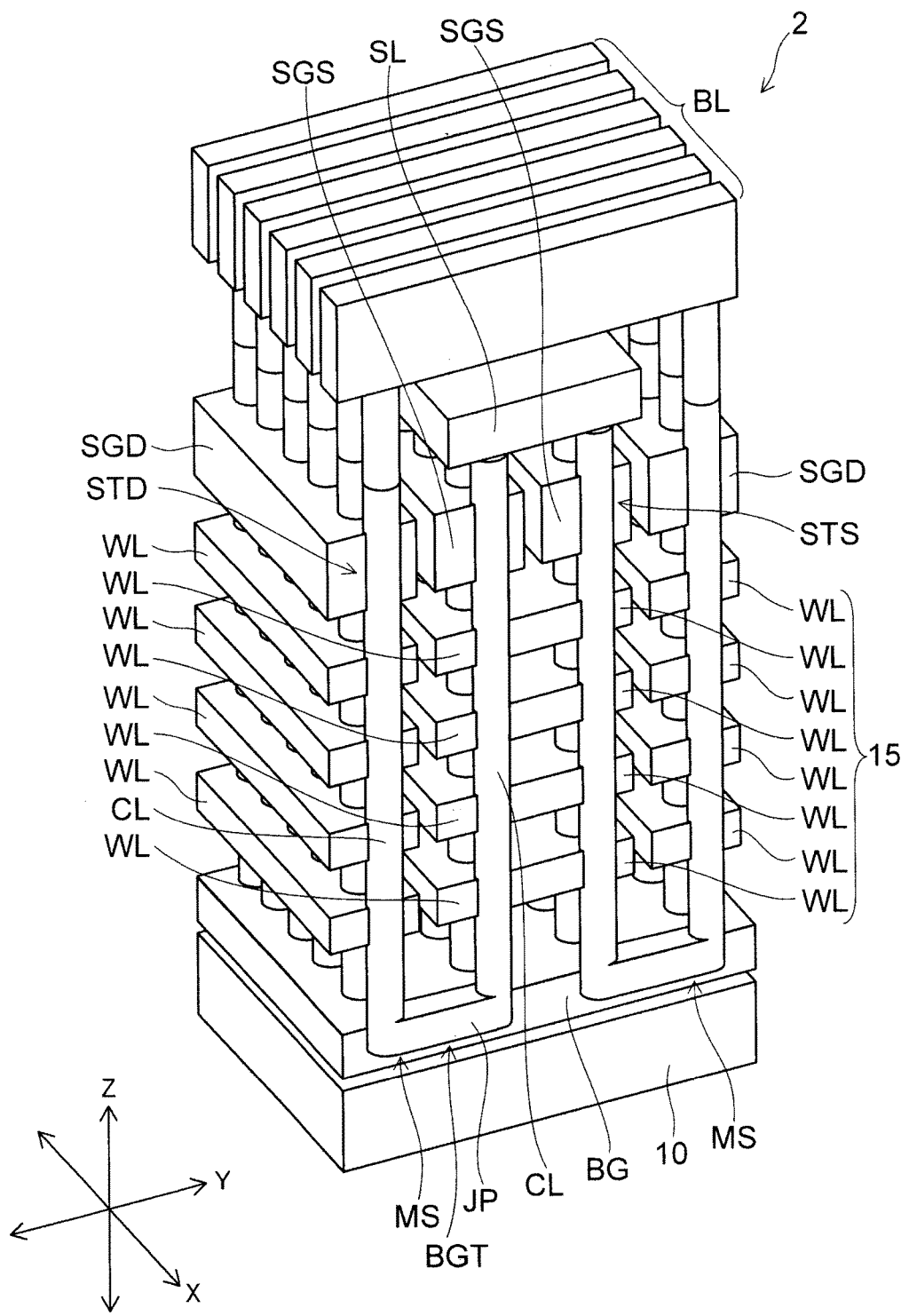
FIG. 9 is a schematic perspective view of another memory cell array of the embodiment

FIG. 9 is a schematic perspective view of a memory cell array of another example of the semiconductor memory device of the embodiment.

Also in FIG. 9, insulating layers and the like are not shown for clarity of illustration similarly to FIG. 1.

A back gate BG is provided on the substrate 10 via an insulating layer. The stacked body 15 in which the plurality of electrode layers WL and the plurality of inter-layer insulating layers 40 are each alternately stacked is formed on the back gate BG.

One memory string MS is formed into a U shape including a pair of columnar portions CL extending in the Z-direction and a coupling portion JP that couples lower ends of the pair of columnar portions CL together. The columnar portion CL is formed into, for example, a circular cylindrical or elliptical cylindrical shape, and penetrates the stacked body 15 to reach the back gate BG.

The drain-side selection gate SGD is provided at an upper end portion of one of the pair of columnar portions CL in the memory string MS having a U shape, while the source-side selection gate SGS is provided at an upper end portion of the other columnar portion CL. The drain-side selection gate SGD and the source-side selection gate SGS are provided on the electrode layer WL in the uppermost layer via the inter-layer insulating layer 40. The stacked body 15 includes the source-side selection gate SGS, the drain-side selection gate SGD, and the plurality of electrode layers WL.

The drain-side selection gate SGD and the source-side selection gate SGS are separated by the trench ST in the Y-direction. The stacked body 15 including the drain-side selection gate SGD and the stacked body 15 including the source-side selection gate SGS are separated by the trench ST in the Y-direction. That is, the stacked bodies 15 between the pair of columnar portions CL of the memory string MS are separated by the trench ST in the Y-direction.

The source layer SL is provided on the source-side selection gate SGS via an insulating layer. A plurality of bit lines BL are provided on the drain-side selection gate SGD and the source layer SL via an insulating layer. The bit lines BL extend in the Y-direction.

Also when the memory cell array 2 is used, the edge portion WLc of the electrode layer WL is entirely covered with the memory film 30, similarly to the embodiment described above. Due to this, an electric field can be concentrated at the corner portions of the edge portion WLc, and thus programming and erasing speeds can be improved.

Moreover, the projecting portions 20c of the channel body 20 are formed in the columnar portion CL, and the memory films 30 are covered with the channel body 20. Due to this, a leakage current can be reduced when a voltage is not applied.

In addition to the above, the memory films 30 are separated from each other in the stacking direction. Due to this, variations in the threshold voltage of the memory cell MC are suppressed, and thus the probability of causing poor reliability can be reduced. Further, the deterioration of the memory film 30 can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
   a stacked body including a plurality of electrode layers separated by a plurality of inter-layer insulating layers in a stacking direction;
   a semiconductor body extending in the stacking direction through the stacked body, the semiconductor body having end portions provided in the stacking direction between the plurality of electrode layers, the end portions of the semiconductor body projecting from a central axis side of the semiconductor body toward an outer side of the semiconductor body;
   source layers and insulating films, wherein the insulating films protrude through the plurality of inter-layer insulating layers and are provided opposite to the end portions between the end portions and the source layers; and
   a charge storage film discontinuously provided between the semiconductor body and the plurality of electrode layers without overlapping said end portions in the stacking direction, said charge storage film including storage film portions separated via the end portions of the semiconductor body.

2. The device according to claim 1, wherein the charge storage film is covered with the semiconductor body.

3. The device according to claim 1, wherein a corner of an edge portion of the plurality of electrode layers is covered with the charge storage film.

4. The device according to claim 1, wherein the plurality of electrode layers include at least any of tungsten and molybdenum.

5. A method for manufacturing a semiconductor memory device comprising:
   forming, on a substrate, a stacked body including a plurality of first layers and a plurality of second layers, the plurality of first layers separately stacked on each other, the plurality of second layers provided between the plurality of first layers;
   forming a hole penetrating the stacked body and extending in a stacking direction of the stacked body;
   causing a side surface of the second layers to be recessed through the hole and exposing an edge portion of the first layers in a side wall of the hole;
   forming, through the hole, a film including a charge storage film on the edge portion of the first layers and the side surface of the second layers;
   forming a semiconductor body on an inner side of the film including the charge storage film;
   forming a trench penetrating the stacked body and extending in the stacking direction;
   removing the second layers through the trench to form a cavity exposing a side surface of the film including the charge storage film; and
   removing, through the trench, the film including the charge storage film exposed in the cavity.

6. The method according to claim 5, further comprising forming an insulating layer on an inner wall of the trench and leaving the cavity between the plurality of the first layers.

7. The method according to claim 5, further comprising forming, through the trench, an insulating film in the cavity.

8. The method according to claim 5, further comprising forming the charge storage film covering the edge portion of the first layers.

9. The method according to claim 5, further comprising forming a projecting portion of the semiconductor body projecting between the plurality of the first layers.

10. The method according to claim 5, further comprising:
    forming an insulating layer in the trench; and
    embedding, on an inner side of the insulating layer, a film having conductivity and electrically connected with the substrate to form a source layer.

11. The method according to claim 5, wherein at least any of a silicon oxide film and a silicon nitride film is used for the plurality of second layers.

* * * * *